United States Patent
Sakuma et al.

(10) Patent No.: US 8,951,845 B2
(45) Date of Patent: Feb. 10, 2015

(54) METHODS OF FABRICATING A FLIP CHIP PACKAGE FOR DRAM WITH TWO UNDERFILL MATERIALS

(71) Applicant: Invensas Corporation, San Jose, CA (US)

(72) Inventors: Kazuo Sakuma, Iwaki (JP); Ilyas Mohammed, Santa Clara, CA (US); Philip Damberg, Cupertino, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/163,145

(22) Filed: Jan. 24, 2014

(65) Prior Publication Data

US 2014/0141568 A1  May 22, 2014

Related U.S. Application Data

(62) Division of application No. 13/307,395, filed on Nov. 30, 2011, now Pat. No. 8,637,992.

(51) Int. Cl.
 *H01L 21/44* (2006.01)

(52) U.S. Cl.
 USPC ........... 438/118; 438/612; 438/614; 438/617; 438/666

(58) Field of Classification Search
 USPC ................. 438/106–112, 113–116, 124–126; 257/737, 774, 778, 790, 795, E33.011, 257/E21.505, E21.506
 See application file for complete search history.

(56) References Cited

U.S. PATENT DOCUMENTS

| | | |
|---|---|---|
| 5,148,265 A | 9/1992 | Khandros et al. |
| 5,148,266 A | 9/1992 | Khandros et al. |
| 5,679,977 A | 10/1997 | Khandros et al. |
| 2006/0006553 A1 | 1/2006 | Fuller et al. |
| 2007/0132107 A1 | 6/2007 | Wu |
| 2007/0178627 A1 | 8/2007 | Jiang et al. |
| 2009/0231820 A1 | 9/2009 | Tanaka |
| 2012/0313238 A1 | 12/2012 | Sato et al. |

OTHER PUBLICATIONS

U.S. Appl. No. 12/842,669.

*Primary Examiner* — Dung A. Le
(74) *Attorney, Agent, or Firm* — Lerner, David, Littenberg, Krumholz & Mentlik, LLP

(57) ABSTRACT

A method of fabricating a microelectronic package can include mounting a microelectronic element to a substrate with a joining material. The mounting can include bonding a front surface of the microelectronic element to a first surface of the substrate with a joining material, and joining contacts arranged within a contact-bearing region of the front surface of the microelectronic element with corresponding substrate contacts at the substrate first surface, the joining creating electrical contact between the microelectronic element and the substrate. The method can also include forming an underfill between the substrate first surface and the contact-bearing region of the front surface of the microelectronic element, the underfill reinforcing the joints between the contacts and the substrate contacts, the joining material having a Young's modulus less than 75% of a Young's modulus of the underfill.

20 Claims, 2 Drawing Sheets

METHODS OF FABRICATING A FLIP CHIP PACKAGE FOR DRAM WITH TWO UNDERFILL MATERIALS

CROSS-REFERENCE TO RELATED APPLICATION

The present application is a divisional of U.S. patent application Ser. No. 13/307,395, filed Nov. 30, 2011, the disclosure of which is incorporated herein by reference.

BACKGROUND OF THE INVENTION

The present invention relates to microelectronic packages and methods of making such packages, and to components useful in such packages.

Microelectronic elements generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 µm thick. The bond pads could include a single layer or multiple layers of metal. The size of the bond pads will vary with the device type but will typically measure tens to hundreds of microns on a side.

As used in this disclosure with reference to a flat chip having a front face, the "area of the chip" should be understood as referring to the area of the front face. In "flip chip" designs, the front face of the chip confronts the face of a package substrate, i.e., the chip carrier, and the contacts on the chip are bonded directly to contacts of the chip carrier by solder balls or other connecting elements. In turn, the chip carrier can be bonded to a circuit panel through terminals overlying the front face of the chip. The "flip chip" design provides a relatively compact arrangement; each chip occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference.

Certain innovative mounting techniques offer compactness approaching or equal to that of conventional flip-chip bonding. Packages which can accommodate a single chip in an area of the circuit panel equal to or slightly larger than the area of the chip itself are commonly referred to as "chip-sized packages."

Conventional microelectronic packages may have reliability challenges because of a non-optimal stress distribution inside of the package and a mismatch of the coefficient of thermal expansion (CTE) between a semiconductor chip, for example, and the structure to which the chip is bonded. For example, when the semiconductor chip is bonded to conductive elements of a polymeric substrate, the electrical connections between the chip and the higher CTE structure of the substrate will be under stress due to CTE mismatch.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device.

Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in microelectronic packages, there is still a need for improvements in order to improve the performance of and minimize the stress distribution inside of such packages, while enhancing electrical interconnection reliability. These attributes of the present invention may be achieved by the construction of the microelectronic packages as described hereinafter.

BRIEF SUMMARY OF THE INVENTION

In accordance with an aspect of the invention, a microelectronic package can include a substrate having a first surface and a plurality of substrate contacts at the first surface and a microelectronic element having a front surface and contacts arranged within a contact-bearing region of the front surface. The contacts of the microelectronic element can face the substrate contacts and can be joined thereto. An underfill can be disposed between the substrate first surface and the contact-bearing region of the front surface of the microelectronic element. The underfill can reinforce the joints between the contacts and the substrate contacts. A joining material can bond the substrate first surface with the front surface of the microelectronic element. The joining material can have a Young's modulus less than 75% of a Young's modulus of the underfill.

In a particular embodiment, the Young's modulus of the underfill can be greater than 5 GPa, and the Young's modulus of the joining material can be less than 5 GPa. In one embodiment, the underfill can be a different material than the joining material. In an exemplary embodiment, the underfill can be a no-flow underfill. In a particular embodiment, the underfill can be an epoxy having silica particles dispersed therein. In one embodiment, the front surface of the microelectronic element can also include first and second peripheral regions between the contact-bearing region and first and second opposed edges of the front surface of the microelectronic element. The underfill may not contact the first and second peripheral regions.

In an exemplary embodiment, the joining material can include at least one of an adhesive pad, a die attach adhesive, epoxy, and silicone. In a particular embodiment, the joining material can extend to a peripheral edge of the substrate. In one embodiment, the joining material may not extend to a peripheral edge of the substrate. In an exemplary embodiment, the joining material may be disposed adjacent first and second opposed edges of the contact-bearing region. In a particular embodiment, the microelectronic package can also include an overmold region overlying a rear surface of the microelectronic element and the first surface of the substrate. In one embodiment, the overmold region can be a different material than both the underfill and the joining material. In an exemplary embodiment, the overmold region can be the same material as exactly one of the underfill and the joining material.

In one embodiment, the contact-bearing region can extend up to one-third of a distance between first and second opposed edges of the front surface of the microelectronic element. In a particular embodiment, the contact-bearing region can be entirely located within a middle third of a distance between the first and second opposed edges of the front surface of the microelectronic element. In an exemplary embodiment, the contact-bearing region can be located adjacent a peripheral edge of the front surface of the microelectronic element. In one embodiment, the joints between the contacts and the substrate contacts can include at least one of solder balls and conductive pillars.

In a particular embodiment, the underfill can surround the joints in the contact-bearing region. In an exemplary embodiment, the microelectronic element can embody a greater number of active devices to provide memory storage array function than any other function. In one embodiment, the microelectronic element can include a dynamic random access memory element. In a particular embodiment, the microelectronic element can be a first microelectronic element, and the microelectronic package can also include a second microelectronic element adjacent the first microelectronic element. The second microelectronic element can have second contacts facing the substrate contacts and can be joined thereto.

In an exemplary embodiment, the substrate can have a second surface opposite the first surface and can also include at least one aperture extending between the first and second surfaces. The underfill can extend within the at least one aperture. In one embodiment, the contact-bearing region can be entirely located within a middle third of a distance between first and second opposed edges of the front surface of the microelectronic element. The at least one aperture can overlie at least a portion of the contact-bearing region. In a particular embodiment, the contacts can be arranged in parallel rows. In an exemplary embodiment, the contacts can be arranged in at least two parallel rows. At least one of the apertures can extend between adjacent parallel rows of the substrate contacts joined to the contacts.

In one embodiment, the substrate can consist essentially of a material having a coefficient of thermal expansion in a plane of the substrate of less than 30 ppm/° C. In a particular embodiment, the microelectronic package can also include terminals exposed at a second surface of the substrate for interconnection with at least one external component. In an exemplary embodiment, the substrate can also include a plurality of conductive vias extending between the first and second surfaces of the substrate. The conductive vias can be electrically connected with at least some of the substrate contacts and at least some of the terminals. In one embodiment, the microelectronic package can also include a plurality of electrically conductive joining units attached to the terminals. The joining units can be configured for joining the microelectronic package with the at least one external component.

Further aspects of the invention can provide systems that incorporate modules and/or components according to the foregoing aspects of the invention, composite chips according to the foregoing aspects of the invention, or both in conjunction with other electronic components electrically connected thereto. In one embodiment, at least one of the other electronic components can be a circuit panel. In an exemplary embodiment, the system can be disposed in and/or mounted to a single housing, which can be a portable housing. In a particular embodiment, a module including a plurality of microelectronic packages as described above can have a circuit panel for transport of signals to and from each of the microelectronic packages. Systems according to preferred embodiments in this aspect of the invention can be more compact than comparable conventional systems.

In accordance with another aspect of the invention, a method of fabricating a microelectronic package can include the steps of mounting a microelectronic element to a substrate with a joining material, and then forming an underfill between the a first surface of the substrate and a contact-bearing region of a front surface of the microelectronic element. The mounting step can include the step of bonding the front surface of the microelectronic element to the first surface of the substrate with the joining material. The mounting step can also include the step of joining contacts arranged within the contact-bearing region of the front surface of the microelectronic element with corresponding substrate contacts at the substrate first surface. The joining can create electrical contact between the microelectronic element and the substrate. The underfill can reinforce the joints between the contacts and the substrate contacts. The joining material can have a Young's modulus less than 75% of a Young's modulus of the underfill.

In a particular embodiment, at least a portion of the bonding and joining steps can be performed simultaneously. In one embodiment, the Young's modulus of the underfill can be greater than 5 GPa, and the Young's modulus of the joining material can be less than 5 GPa. In an exemplary embodiment, the underfill can be a different material than the joining material. In a particular embodiment, the underfill can be a no-flow underfill. In one embodiment, the joining material can be disposed adjacent first and second opposed edges of the contact-bearing region.

In an exemplary embodiment, the method can also include the step of forming an overmold region overlying a rear surface of the microelectronic element and the first surface of the substrate. In a particular embodiment, the contact-bearing region can extend up to one-third of a distance between first and second opposed edges of the front surface of the microelectronic element. In one embodiment, the contact-bearing region can be entirely located within a middle third of the distance between the first and second opposed edges of the front surface of the microelectronic element. In an exemplary embodiment, the underfill can surround the joints in the contact-bearing region. In a particular embodiment, the microelectronic element can embody a greater number of active devices to provide memory storage array function than any other function.

In one embodiment, the substrate can have a second surface opposite the first surface and can also include at least one aperture extending between the first and second surfaces. At least a portion of the underfill can be formed extending through the at least one aperture. In an exemplary embodiment, the contact-bearing region can be entirely located within a middle third of a distance between first and second opposed edges of the front surface of the microelectronic element. The at least one aperture can overlie at least a portion of the contact-bearing region. The portion of the underfill that is formed extending through the at least one aperture can be formed in contact with the contact-bearing region.

In a particular embodiment, the mounting step can include joining the contacts of the microelectronic element to the substrate contacts with electrically conductive masses. In one embodiment, material of the underfill can flow between adjacent ones of the conductive masses during the step of forming the underfill. In an exemplary embodiment, a method of fabricating an assembly including a plurality of microelectronic packages as described above can include the step of joining the microelectronic packages to a circuit panel for transport of signals to and from each of the microelectronic packages.

DETAILED DESCRIPTION

Figure 1:
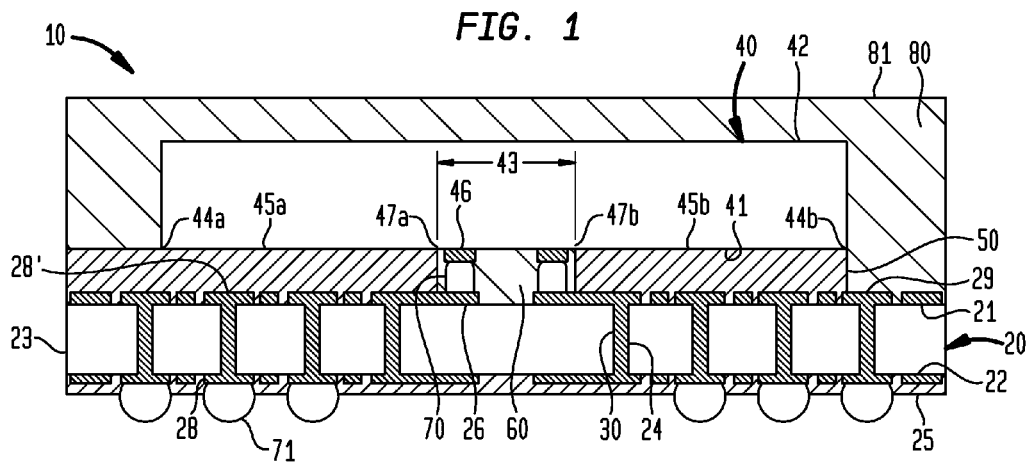
FIG. 1 is a diagrammatic sectional view of a microelectronic package according to an embodiment of the present invention.

As illustrated in FIG. 1, a microelectronic package 10 can include a substrate 20 having a first surface 21 and a second surface 22 remote therefrom and a plurality of conductive vias 30 extending therethrough within respective openings 24 between the first and second surfaces. The microelectronic package 10 can also include a microelectronic element 40 that is bonded to the substrate 20 with a joining material 50, an underfill 60 disposed between the substrate 20 and a contact-bearing region 43 of a front surface 41 of the microelectronic element, and an overmold region 80 overlying a rear surface 42 of the microelectronic element and the first surface 21 of the substrate 20.

The substrate 20 can be partly or entirely made of any suitable dielectric material, such as a polymeric material, or the substrate can be a semiconductor chip, a wafer, or the like. For example, the substrate 20 may comprise a relatively rigid, board-like material such as a thick layer of fiber-reinforced epoxy, such as Fr-4 or Fr-5 board. Regardless of the material employed, the substrate 20 may include a single layer or multiple layers of dielectric material.

In one example, the substrate 20 can consist essentially of a material having a coefficient of thermal expansion ("CTE") in a plane of the substrate (in a direction parallel to the first surface 21 of the substrate) less than 30 parts per million per degree Celsius ("ppm/° C."). In a particular embodiment, the substrate 20 can have a CTE in a plane of the substrate less than 10 ppm/° C. In a particular embodiment, the substrate 20 can be made from a material selected from the group consisting of: semiconductor material, ceramic, and glass. The thickness of the substrate 20 between the first and second surfaces 21 and 22 typically is less than 200 µm, and can be significantly smaller, for example, 130 µm, 70 µm or even smaller.

In a particular embodiment, a plurality of microelectronic packages 10 can be formed simultaneously with a single substrate 20 extending through the plurality of microelectronic packages. After the microelectronic packages 10 are fabricated, the individual microelectronic packages can be separated from one another by dicing the fabricated structure into separate elements, each element containing one microelectronic package 10.

In FIG. 1, the directions parallel to the first surface 21 of the substrate 20 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

The substrate 20 can further include an insulating dielectric layer 25 overlying the second surface 22 of the substrate 20. Such a dielectric layer can electrically insulate conductive elements from the substrate 20. This dielectric layer can be referred to as a "passivation layer" of the substrate 20. The dielectric layer can include an inorganic or organic dielectric material or both. The dielectric layer may include an electrodeposited conformal coating or other dielectric material, for example, a photoimageable polymeric material, for example, a solder mask material.

In the embodiments described herein, a dielectric layer overlying the second surface 22 of the substrate 20 can have a thickness that is substantially less than a thickness of the substrate, such that the substrate can have an effective CTE that is approximately equal to the CTE of the material of the substrate, even if the CTE of the dielectric layer is substantially higher than the CTE of the substrate material. In one example, the substrate 20 can have an effective CTE less than 10 ppm/° C.

The openings 24 can be arranged in any top-view geometric configuration, including for example, an m×n array, each of m and n being greater than 1. The plurality of openings 24 can include a plurality of conductive vias 30 extending within respective ones of the openings, each conductive via extending between the first and second surfaces 21, 22 of the substrate. In a particular embodiment, first and second conductive vias 30 can be connectable to respective first and second electric potentials.

The substrate 20 can include a plurality of substrate contacts 26 exposed at the first surface 21. The substrate 20 can include a plurality of terminals 28 exposed at the second surface 21 for interconnection with at least one external component. The conductive vias 30 can provide an electrical connection through the substrate 20 from at least some of the terminals 28 at the second surface 22 to conductive elements 28' at the first surface 21, such conductive elements being electrically connected with at least some of the substrate contacts 26. In a particular example, the conductive elements 28' electrically connected with the substrate contacts 26 can be exposed within the openings 24 such that a conductive mass such as the conductive mass 71 can extend between a respective conductive element 28' and the second surface 22, such conductive mass being exposed at the second surface for interconnection with an external component. In such an example, the conductive elements 28' can serve as terminals for joining at least one external component to the second surface 22 of the substrate 20.

To form any of the substrate contacts 26, the terminals 28, or any of the other conductive elements described herein, an exemplary method involves depositing a metal layer by one or more of sputtering a primary metal layer onto exposed surfaces of the substrate 20, plating, or mechanical deposition. Mechanical deposition can involve the directing a stream of heated metal particles at high speed onto the surface to be coated. This step can be performed by blanket deposition onto the substrate 20, for example.

While essentially any technique usable for forming conductive elements can be used to form the substrate contacts 26 and the terminals 28, particular techniques as discussed in greater detail in the commonly owned U.S. patent application Ser. No. 12/842,669, filed Jul. 23, 2010, can be employed, which is hereby incorporated by reference herein. Such techniques can include, for example, selectively treating a surface with a laser or with mechanical processes such as milling or sandblasting so as to treat those portions of the surface along the path where the conductive element is to be formed differently than other portions of the surface. For example, a laser or mechanical process may be used to ablate or remove a material such as a sacrificial layer from the surface only along a particular path and thus form a groove extending along the path. A material such as a catalyst can then be deposited in the groove, and one or more metallic layers can be deposited in the groove.

In some embodiments, the microelectronic element 40 can be a semiconductor chip, a wafer, or the like. For example, the microelectronic element 40 can include a memory storage element such as a dynamic random access memory element ("DRAM"). As used herein, a "memory storage element" refers to a multiplicity of memory cells arranged in an array, together with circuitry usable to store and retrieve data therefrom, such as for transport of the data over an electrical interface. In a particular example, the microelectronic package 10 can be included in a single in-line memory module ("SIMM") or a dual in-line memory module ("DIMM"). In another example, the microelectronic package 10 can be included in a high speed DDR3, DDR4, or GDDR module. In one example, the microelectronic element 40 can embody a greater number of active devices to provide memory storage array function than any other function.

The microelectronic element 40 can have a front surface 41 and a rear surface 42 remote therefrom. The microelectronic element 40 can have electrically conductive contacts 46 arranged within a contact-bearing region 43 of the front surface between first and second opposed edges 44a and 44b of the front surface 41. In one example, the contact-bearing region 43 can extend up to one-third of a distance between the first and second opposed edges 44a, 44b of the front surface 41. As shown in FIG. 1, the contact-bearing region 43 can be entirely located within a middle third of the distance between the first and second opposed edges 44a, 44b of the front surface 41.

The front surface 41 of the microelectronic element 40 can also have first and second peripheral regions 45a and 45b between the contact-bearing region 43 and the respective first and second opposed edges 44a and 44b of the front surface of the microelectronic element. In a particular embodiment, such first and second peripheral regions 45a and 45b can be devoid of the contacts 46.

The contacts 46 can be exposed at the front surface 41 of the microelectronic element 40. As described herein, the contacts 46 of the microelectronic element 40 can also be referred to as "chip contacts." As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element that is exposed at a surface of a structure can project from such surface; can be flush with such surface; or can be recessed relative to such surface and exposed through a hole or depression in the structure.

The contacts 46 of the microelectronic element 40 are exposed at the front surface 41 within a contact-bearing region 43 of the microelectronic element. For example, the contacts 46 can be arranged in one or more parallel rows adjacent the center of the front surface 41. In a particular embodiment, the contacts 46 of the microelectronic element 40 can be arranged in two parallel rows corresponding to the two parallel rows of substrate contacts 26 shown in FIG. 4.

In an exemplary embodiment, the microelectronic element 40 can be flip-chip mounted onto the first surface 21 of the substrate 20, such that the contacts 46 of the microelectronic element 40 can face the substrate contacts 26 and can be joined thereto.

Connection between each of the contacts 46 of the microelectronic element 40 and the substrate contacts 26 of the substrate 20 (or connection between any of the other conductive elements described herein) can be through electrically conductive masses 70 or electrically conductive bond material. Such conductive masses can comprise a fusible metal having a relatively low melting temperature, e.g., solder, tin, or a eutectic mixture including a plurality of metals. Alternatively, such conductive masses can include a wettable metal, e.g., copper or other noble metal or non-noble metal having a melting temperature higher than that of solder or another fusible metal. Such wettable metal can be joined with a corresponding feature, e.g., a fusible metal feature of an interconnect element. In a particular embodiment, such conductive masses 70 can include a conductive material interspersed in a medium, e.g., a conductive paste, e.g., metal-filled paste, solder-filled paste or isotropic conductive adhesive or anisotropic conductive adhesive. Connection between each of the terminals 28 and components external to the substrate 20 can be through conductive masses 71 that can be any of the materials described above with reference to the conductive masses 70.

In a particular example, the joints between the contacts 46 and the substrate contacts 26 can include conductive masses 70 in the form of solder balls. In such an example including solder balls, such solder balls can be reflowed or sintered to improve the strength of the joint between the contacts 46 and the substrate contacts 26. In another example, the joints between the contacts 46 and the substrate contacts 26 can include conductive pillars extending from at least one of the contacts 46 and the substrate contacts 26.

In one embodiment, the microelectronic package 10 can include a plurality of microelectronic elements 40, each microelectronic element having a front surface 41 disposed in a common plane confronting the first surface 21 of the substrate 20 and contacts 46 facing corresponding ones of the substrate contacts 26. In an example of such an embodiment, some of the substrate contacts 26 can be joined with contacts 46 of a first microelectronic element 40 and others of the substrate contacts can be joined with contacts of a second microelectronic element.

The joining material 50 can bond the first surface 21 of the substrate 20 with the front surface 41 of the microelectronic element 40. In one example, the joining material 50 can include at least one of a die attach adhesive, epoxy, and a silicone elastomer. One or more layers of the joining material 50 can be used. In a particular embodiment, the joining material 50 can extend between the first surface 21 of the substrate 20 and the first and second peripheral regions 45a, 45b of the front surface 41 of the microelectronic element 40. In one example, the joining material 50 can mechanically support the microelectronic element 40 at the first and second peripheral regions 45a, 45b. The joining material 50 can overlie the conductive elements 28' that can provide an electrical connection between conductive vias 30 extending from the terminals 28 and leads 29 extending from the substrate contacts 26. In a particular example, the joining material 50 may not contact the contact-bearing region 43 of the front surface 41 of the microelectronic element 40.

As used herein, a "lead" is a portion of or the entire electrical connection extending between two electrically conductive elements, such as the lead 29 extending between the contacts 46 of the microelectronic element 40 to the terminals 28 at the second surface 22 of the substrate 20.

In one embodiment, the joining material 50 can be disposed adjacent first and second opposed edges 47a and 47b of the contact-bearing region 43. As shown at the left side of FIG. 1, the joining material 50 can extend to a peripheral edge 23 of the substrate 20. Alternatively, as shown at the right side of FIG. 1, the joining material 50 may not extend to the peripheral edge 23 of the substrate 20. In a particular example, some portions of the joining material 50 can extend to the peripheral edge 23 of the substrate 20, while other portions of the joining material may not extend to the peripheral edge of the substrate.

In one example, the joining material 50 can cured or partially cured after the contacts 46 of the microelectronic element 40 are flip-chip bonded to the substrate contacts 26. In another example, at least a portion of a step of bonding the front surface 41 of the microelectronic element 40 to the first surface 21 of the substrate 20 with the joining material 50 can be performed simultaneously with at least a portion of a step of joining (e.g., flip-chip bonding) the contacts 46 of the microelectronic element 40 with corresponding ones of the substrate contacts 26 at the first surface of the substrate.

The underfill 60 can be disposed between the first surface 21 of the substrate 20 and the contact-bearing region 43 of the front surface 41 of the microelectronic element 40. In a particular example, the underfill 60 can reinforce the joints between the contacts 46 of the microelectronic element 40 and the substrate contacts 26. In one example, the underfill 60 can extend around the joints between the contacts 46 of the microelectronic element 40 and the substrate contacts 26 in the contact-bearing region 23. In an exemplary process for fabricating the microelectronic package 10, material of the underfill 60 can flow between adjacent ones of the conductive masses 70 extending between joined contacts 26 and 46 during the step of forming the underfill. In one embodiment, the underfill 60 may not contact the first and second peripheral regions 45a, 45b of the front surface 41 of the microelectronic element 40.

The underfill 60 can be a different material than the joining material 50. In one example, the underfill 60 can have a Young's modulus that is greater than the Young's modulus of the joining material 50. In a particular embodiment, the joining material can have a Young's modulus that is less than 75% of the Young's modulus of the underfill. In a further example, the Young's modulus of the underfill can be greater than 5 GPa, and the Young's modulus of the joining material can be less than 5 GPa. In a particular example, the underfill 60 can be a no-flow underfill. In one example, the underfill 60 can be a large filler polymer, for example, an epoxy having silica particles dispersed therein.

The inclusion of a relatively low modulus joining material 50 in the microelectronic package 10 can permit the ball grid array comprising the conductive masses 71 at the second surface 22 to have some freedom of motion relative to the front surface 41 of the microelectronic element 40, thereby allowing such a joining material 50 to absorb some of the stresses applied to the microelectronic package due to differential thermal expansion between the substrate 20 and the microelectronic element. The inclusion of a relatively high modulus underfill 60 can allow the joints (e.g., the conductive masses 70) between the substrate contacts 26 and the contacts 46 of the microelectronic element 40 to withstand stresses applied to such joints due to the freedom of motion of the substrate 20 relative to the microelectronic element.

The microelectronic package 10 can also include an overmold region 80 overlying a rear surface 42 of the microelectronic element 40 and the first surface 21 of the substrate 20. One or more overmold regions 80 can cover portions of the rear surface 42 of the microelectronic element 40 and portions of the second surface 22 of the substrate 20. In a particular embodiment, the overmold region 80 can cover portions of leads 29 extending between the contacts 46 and the substrate contacts 26. In a process according to a particular embodiment, the overmold region 80 can be injected onto the rear surface 42 of the microelectronic element 40 second surface 22 of the substrate 20. In one example, the overmold region 80 can be a different material than both the underfill 60 and the joining material 50. In an exemplary embodiment, the overmold region 80 can be the same material as exactly one of the underfill 60 and the joining material 50. In a particular example, the overmold region 80 can be omitted from the microelectronic package 10.

Figure 2:
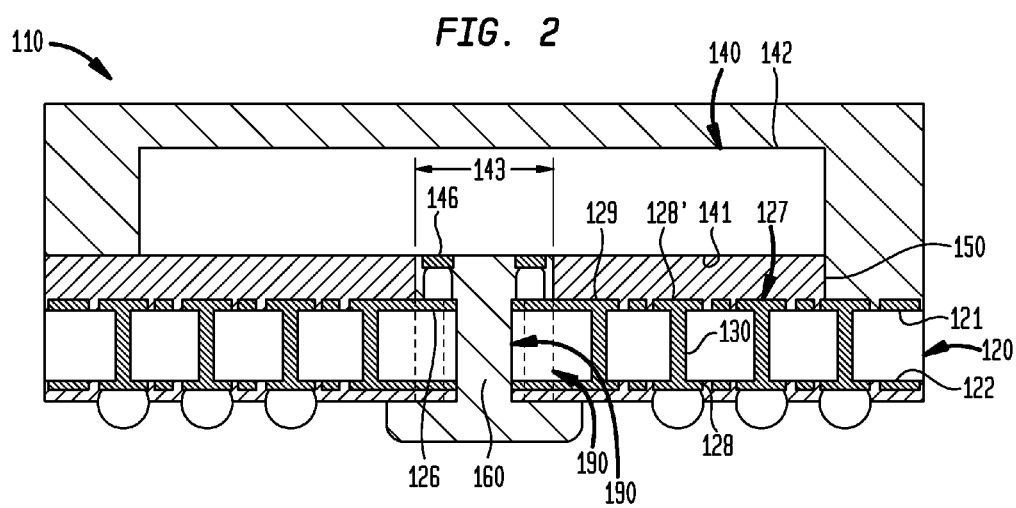
FIG. 2 is a diagrammatic sectional view of a microelectronic assembly according to another embodiment having at least one aperture extending through the substrate.

FIG. 2 illustrates a variation of the microelectronic package 10 of FIG. 1 having an alternate configuration. The microelectronic package 110 shown in FIG. 2 is the same as the microelectronic package 10 described above, except that the microelectronic package 110 includes at least one aperture 190 extending between the first and second surfaces 121 and 122 of the substrate 120, and the underfill 160 can be formed extending through the at least one aperture.

In one example, the underfill 160 can extend within the at least one aperture 190. In a particular embodiment, the underfill 160 can extend through the at least one aperture 190 onto the second surface 122. As shown in FIG. 2, the at least one aperture 190 can overlie the contact-bearing region 143 of the front surface 141 of the microelectronic element 140. In a particular example, wherein the contacts 146 of the microelectronic element 140 are arranged in at least two parallel rows, at least one of the apertures 190 can extend between adjacent parallel rows of the substrate contacts 126 joined to the contacts 146. In an exemplary embodiment, a portion of the underfill 160 formed extending through the at least one aperture 190 can be formed in contact with the contact-bearing region 143 of the front surface 141 of the substrate 140.

Figure 3:
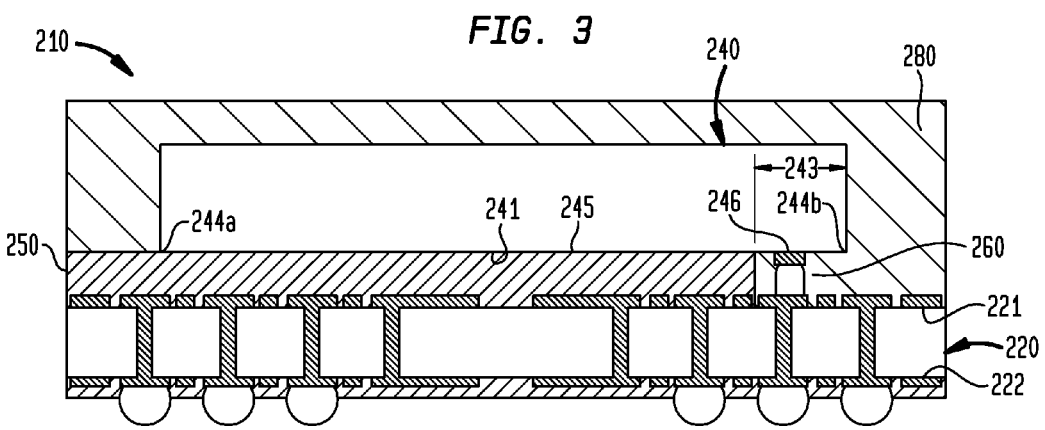
FIG. 3 is a diagrammatic sectional view of a microelectronic assembly according to yet another embodiment including a microelectronic element having contacts adjacent a peripheral edge of the front surface thereof.

FIG. 3 illustrates a variation of the microelectronic package 10 of FIG. 1 having another alternate configuration. The microelectronic package 210 shown in FIG. 3 is the same as the microelectronic package 10 described above, except that the microelectronic package 210 includes a microelectronic element 240 having electrically conductive contacts 246 arranged within a contact-bearing region 243 of the front surface between first and second opposed peripheral edges 244a and 244b of the front surface 241, and the contact-bearing region is located adjacent the second peripheral edge of the front surface of the microelectronic element.

As shown in FIG. 3, the joining material 250 can extend between the first surface 221 of the substrate 220 and a second region 245 of the front surface 241 of the microelectronic element 240, the second region extending between the contact-bearing region 243 and the first peripheral edge 244a of the front surface of the microelectronic element. In a particular example, the second region 245 can include the geometric center of the front surface 241 of the microelectronic element 240.

The underfill 260 can be disposed between the first surface 221 of the substrate 220 and the contact-bearing region 243 of the front surface 241 of the microelectronic element 240. In one embodiment, the underfill 260 may not contact the second region 245 of the front surface 241 of the microelectronic element 240. As shown in FIG. 3, the underfill 260 can extend between the second region 245 of the front surface 241 of the microelectronic element 240 and the second peripheral edge 244b of the front surface.

The microelectronic package 210 can also include an overmold region 280 overlying a rear surface 242 of the microelectronic element 240 and the first surface 221 of the substrate 220. As shown in FIG. 3, the overmold region 280 and the underfill 260 can be a single, contiguous material. Such a single, contiguous overmold region 280 and underfill 260 can be deposited in a single process step. In a particular embodiment, the overmold region 280 and the underfill 260 can be different materials. In one example, the overmold region 280 and the underfill 260 can be deposited in separate process steps.

Figure 4:
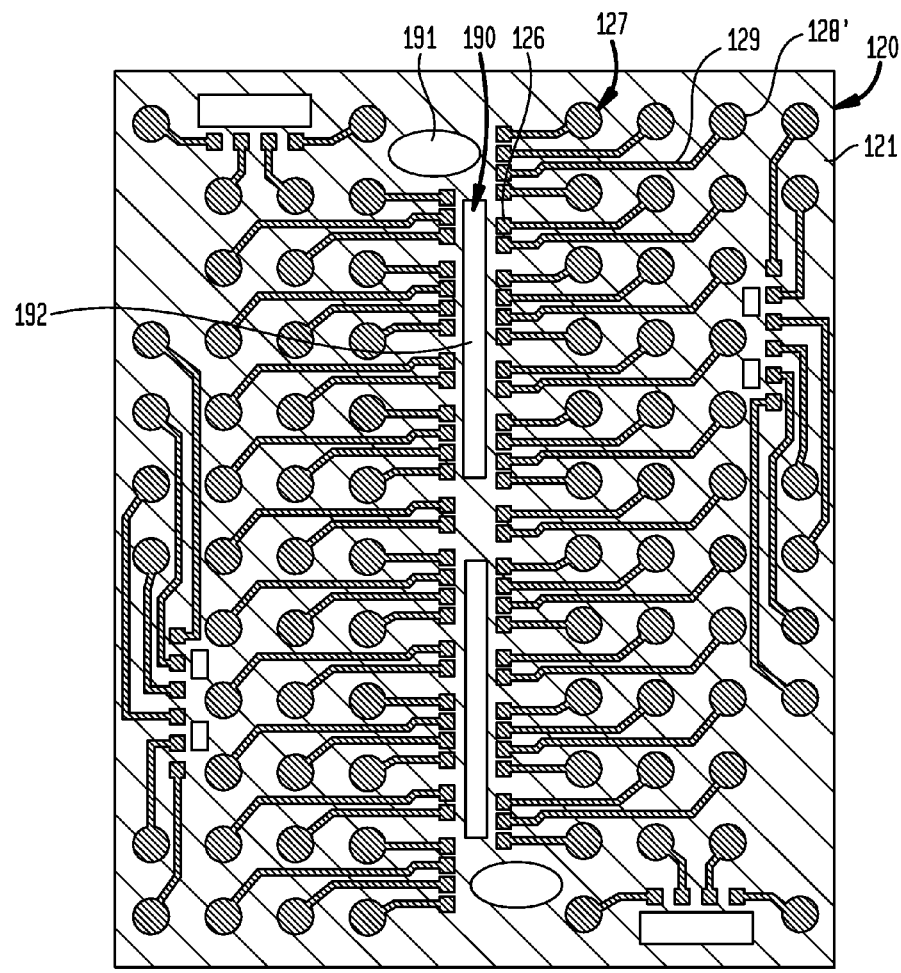
FIG. 4 is a bottom view of a conductive layer suitable for use in the microelectronic assembly of FIG. 2, showing some potential locations for at least one aperture extending through the substrate.

FIG. 4 shows a bottom view of a conductive layer 127 suitable for use in the microelectronic assembly of FIG. 2, showing some potential locations for the at least one aperture 190 extending through the substrate. As shown in FIG. 4, the conductive layer 127 can include leads 129 extending from the substrate contacts 126 to conductive elements 128' at the first surface 121 of the substrate 120 that can be electrically connected to the terminals 128 at the second surface 122 of the substrate by the conductive vias 130.

One or more of the apertures 190 can extend between adjacent parallel rows of the substrate contacts 126 joined to the contacts 146, and one or more of the apertures 190 can extend laterally outside of the rows of substrate contacts, such as in the location 191 shown in FIG. 4. In one example, there can be a single aperture 190 extending throughout a space 192 located between adjacent rows of the substrate contacts 126. In another example, there can be a plurality of apertures 190, each aperture at least partially overlying the contact-bearing region 143 of the microelectronic element 140.

Figure 5:
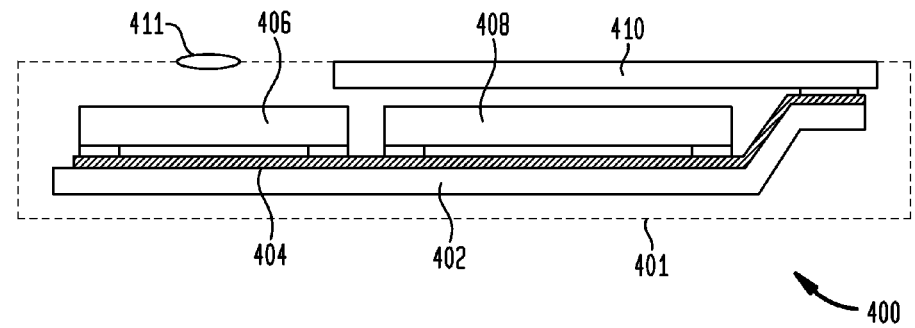
FIG. 5 is a schematic depiction of a system according to one embodiment of the invention.

The microelectronic packages 10 and 110 described above with reference to FIGS. 1-4 can be utilized in construction of diverse electronic systems, such as the system 400 shown in FIG. 5. For example, the system 400 in accordance with a further embodiment of the invention includes a plurality of modules or components 406 such as the microelectronic packages 10 and 110 as described above in conjunction with other electronic components 408 and 410.

The system 400 can includes a plurality of sockets 405, each socket including a plurality of contacts 407 at one or both sides of the socket, such that each socket 405 can be suitable for mating with corresponding exposed edge contacts or exposed module contacts of a corresponding module or component 406. In the exemplary system 400 shown, the system can include a circuit panel or motherboard 402 such as a flexible printed circuit board, and the circuit panel can include numerous conductors 404, of which only one is depicted in FIG. 5, interconnecting the modules or components 406 with one another. Such a circuit panel 402 can transport signals to and from each of the microelectronic packages 10 or 110 included in the system 400. However, this is merely exemplary; any suitable structure for making electrical connections between the modules or components 406 can be used.

In a particular embodiment, the system 400 can also include a processor such as the semiconductor chip 408, such that each module or component 406 can be configured to transfer a number N of data bits in parallel in a clock cycle, and the processor can be configured to transfer a number M of data bits in parallel in a clock cycle, M being greater than or equal to N.

In one example, the system 400 can include a processor chip 408 that is configured to transfer thirty-two data bits in parallel in a clock cycle, and the system can also include four modules 406 such as the microelectronic package 10 described with reference to FIG. 1, each module 406 configured to transfer eight data bits in parallel in a clock cycle (i.e., each module 406 can include first and second microelectronic elements, each of the two microelectronic elements being configured to transfer four data bits in parallel in a clock cycle).

In another example, the system 400 can include a processor chip 408 that is configured to transfer sixty-four data bits in parallel in a clock cycle, and the system can also include four modules 406 such as the microelectronic package 10 described with reference to FIG. 1, each module 406 configured to transfer sixteen data bits in parallel in a clock cycle (i.e., each module 406 can include two sets of first and second microelectronic elements, each of the four microelectronic elements being configured to transfer four data bits in parallel in a clock cycle).

In the example depicted in FIG. 5, the component 408 is a semiconductor chip and component 410 is a display screen, but any other components can be used in the system 400. Of course, although only two additional components 408 and 410 are depicted in FIG. 5 for clarity of illustration, the system 400 can include any number of such components.

Modules or components 406 and components 408 and 410 can be mounted in a common housing 401, schematically depicted in broken lines, and can be electrically interconnected with one another as necessary to form the desired circuit. The housing 401 is depicted as a portable housing of the type usable, for example, in a cellular telephone or personal digital assistant, and screen 410 can be exposed at the surface of the housing. In embodiments where a structure 406 includes a light-sensitive element such as an imaging chip, a lens 411 or other optical device also can be provided for routing light to the structure. Again, the simplified system shown in FIG. 5 is merely exemplary; other systems, including systems commonly regarded as fixed structures, such as desktop computers, routers and the like can be made using the structures discussed above.

In any or all of the microelectronic packages described in the foregoing, the rear surface of one or more of the microelectronic elements can be at least partially exposed at an exterior surface of the microelectronic package after completing fabrication. Thus, in the microelectronic package 10 described above with respect to FIG. 1, the rear surface 42 of the microelectronic element 40 can be partially or fully exposed at an exterior surface 81 of the overmold region 80 in the completed microelectronic package 10.

In any of the embodiments described above, the microelectronic package may include a heat spreader made of metal, graphite or any other suitable thermally conductive material.

In one embodiment, the heat spreader can include a metallic layer disposed adjacent to the microelectronic element. The metallic layer may be exposed at the rear surface of the microelectronic element. Alternatively, the heat spreader can include an overmold or an encapsulant covering at least the rear surface of the microelectronic element.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A method of fabricating a microelectronic package, comprising:
    mounting a microelectronic element to a substrate with a joining material, the mounting including:
        bonding a front surface of the microelectronic element to a first surface of the substrate with a joining material; and
        joining contacts arranged within a contact-bearing region of the front surface of the microelectronic element with corresponding substrate contacts at the substrate first surface, the joining creating electrical contact between the microelectronic element and the substrate; and then
    forming an underfill between the substrate first surface and the contact-bearing region of the front surface of the microelectronic element, the underfill reinforcing the joints between the contacts and the substrate contacts, the joining material having a Young's modulus less than 75% of a Young's modulus of the underfill,
    wherein the substrate has a second surface opposite the first surface and further includes at least one aperture extending between the first and second surfaces, and at least a portion of the underfill is formed extending through the at least one aperture.

2. A method as claimed in claim 1, wherein at least a portion of the bonding and joining steps are performed simultaneously.

3. A method as claimed in claim 1, wherein the Young's modulus of the underfill is greater than 5 GPa, and the Young's modulus of the joining material is less than 5 GPa.

4. A method as claimed in claim 1, wherein the underfill is a different material than the joining material.

5. A method as claimed in claim 1, wherein the underfill is a no-flow underfill.

6. A method as claimed in claim 1, wherein the joining material is disposed adjacent first and second opposed edges of the contact-bearing region.

7. A method as claimed in claim 1, further comprising forming an overmold region overlying a rear surface of the microelectronic element and the first surface of the substrate.

8. A method as claimed in claim 1, wherein the contact-bearing region extends up to one-third of a distance between first and second opposed edges of the front surface of the microelectronic element.

9. A method as claimed in claim 1, wherein the microelectronic element embodies a greater number of active devices to provide memory storage array function than any other function.

10. A method as claimed in claim 1, wherein the contact-bearing region is entirely located within a middle third of a distance between first and second opposed edges of the front surface of the microelectronic element, wherein the at least one aperture overlies at least a portion of the contact-bearing region, and wherein the portion of the underfill that is formed extending through the at least one aperture is formed in contact with the contact-bearing region.

11. A method as claimed in claim 1, wherein the mounting step includes joining the contacts of the microelectronic element to the substrate contacts with electrically conductive masses.

12. A method as claimed in claim 11, wherein material of the underfill flows between adjacent ones of the conductive masses during the step of forming the underfill.

13. A method as claimed in claim 1, wherein the contact-bearing region is entirely located within a middle third of a distance between the first and second opposed edges of the front surface of the microelectronic element.

14. A method as claimed in claim 1, wherein the front surface of the microelectronic element further includes first and second peripheral regions between the contact-bearing region and first and second opposed edges of the front surface of the microelectronic element, and the underfill does not contact the first and second peripheral regions.

15. A method as claimed in claim 1, wherein the underfill surrounds the joints in the contact-bearing region.

16. A method of fabricating a microelectronic package, comprising:
    mounting a microelectronic element to a substrate with a joining material, the mounting including:
        bonding a front surface of the microelectronic element to a first surface of the substrate with a joining material; and
        joining contacts arranged within a contact-bearing region of the front surface of the microelectronic element with corresponding substrate contacts at the substrate first surface, the joining creating electrical contact between the microelectronic element and the substrate; and then
    forming an underfill between the substrate first surface and the contact-bearing region of the front surface of the microelectronic element, the underfill reinforcing the joints between the contacts and the substrate contacts, the joining material having a Young's modulus less than 75% of a Young's modulus of the underfill,
    wherein the contact-bearing region is entirely located within a middle third of a distance between the first and second opposed edges of the front surface of the microelectronic element, and
    wherein the front surface of the microelectronic element further includes first and second peripheral regions between the contact-bearing region and first and second opposed edges of the front surface of the microelectronic element, and the underfill does not contact the first and second peripheral regions.

17. A method as claimed in claim 16, wherein the underfill surrounds the joints in the contact-bearing region.

18. A method as claimed in claim 16, wherein the Young's modulus of the underfill is greater than 5 GPa, and the Young's modulus of the joining material is less than 5 GPa.

19. A method as claimed in claim 16, wherein the underfill is a different material than the joining material.

20. A method as claimed in claim 16, wherein the underfill is a no-flow underfill.

\* \* \* \* \*